(12) United States Patent
Teranishi et al.

(10) Patent No.: US 12,302,488 B2
(45) Date of Patent: May 13, 2025

(54) ELECTRONIC CONTROL DEVICE

(71) Applicant: Hitachi Astemo, Ltd., Hitachinaka (JP)

(72) Inventors: Minami Teranishi, Tokyo (JP); Shinya Kawakita, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 231 days.

(21) Appl. No.: 18/009,853

(22) PCT Filed: Mar. 10, 2021

(86) PCT No.: PCT/JP2021/009694
§ 371 (c)(1),
(2) Date: Dec. 12, 2022

(87) PCT Pub. No.: WO2021/256021
PCT Pub. Date: Dec. 23, 2021

(65) Prior Publication Data
US 2023/0156903 A1 May 18, 2023

(30) Foreign Application Priority Data

Jun. 17, 2020 (JP) ................................. 2020-104729

(51) Int. Cl.
*H05K 1/00* (2006.01)
*H05K 1/02* (2006.01)
(Continued)

(52) U.S. Cl.
CPC .......... *H05K 1/0204* (2013.01); *H05K 1/181* (2013.01); *H05K 7/20409* (2013.01); *H05K 7/20445* (2013.01)

(58) Field of Classification Search
CPC .. H05K 1/0204; H05K 1/181; H05K 7/20409; H05K 7/20445
(Continued)

(56) References Cited

U.S. PATENT DOCUMENTS

| 5,508,908 | A | 4/1996 | Kazama et al. |
| 8,743,540 | B1 * | 6/2014 | Nishihara .......... H05K 7/20572 165/80.4 |
| 10,582,644 | B1 * | 3/2020 | Hur ........................ H05K 1/181 |
| 2010/0053896 | A1 * | 3/2010 | Chen ..................... G03B 21/16 361/697 |

(Continued)

FOREIGN PATENT DOCUMENTS

| FR | 3060202 A1 * | 6/2018 | ............. F28F 13/00 |
| JP | H-05-38144 A | 2/1993 | |

(Continued)

OTHER PUBLICATIONS

International Search Report with English Translation and Written Opinion dated Jun. 1, 2021 in corresponding International Application No. PCT/JP2021/009694.

*Primary Examiner* — Zhengfu J Feng
(74) *Attorney, Agent, or Firm* — Foley & Lardner LLP (57) ABSTRACT

An electronic control device includes a first circuit board having a first mounting surface on which a first electronic component is mounted, a second circuit board having a second mounting surface on which a second electronic component is mounted, and a base member disposed between the first mounting surface and the second mounting surface so as to face the first electronic component and the second electronic component, where a first heat-conducting material is disposed between the base member and the first electronic component, a second heat-conducting material is disposed between the base member and the second electronic component, the base member includes a first region that at least does not overlap the second circuit board when viewed in a line-of-sight direction normal to the first mounting surface and the second mounting surface, and a second region that overlaps both of the first circuit board and the second circuit board when viewed in the line-of-sight direction, a heat dissipation unit including a plurality of heat dissipation fins is provided in the first region of the base (Continued)

member, and a ventilation hole penetrating between the heat dissipation unit and an outside is provided in the second region of the base member.

13 Claims, 5 Drawing Sheets

(51) Int. Cl.
*H05K 1/18* (2006.01)
*H05K 7/20* (2006.01)

(58) Field of Classification Search
USPC .......................................................... 361/704
See application file for complete search history.

(56) References Cited

U.S. PATENT DOCUMENTS

| | | | | |
|---|---|---|---|---|
| 2010/0097769 | A1* | 4/2010 | Lin | ........................... G06F 1/20 |
| | | | | 361/720 |
| 2011/0128703 | A1* | 6/2011 | Fujihara | ............. H05K 7/20145 |
| | | | | 361/695 |
| 2017/0083058 | A1* | 3/2017 | Janak | ......................... G06F 1/20 |
| 2019/0140520 | A1* | 5/2019 | Sato | ........................ H02K 11/33 |

FOREIGN PATENT DOCUMENTS

| JP | 2005-317480 A | 11/2005 |
|---|---|---|
| JP | 2006-319134 A | 11/2006 |
| JP | 2012-175032 A | 9/2012 |
| JP | 2014-36050 A | 2/2014 |
| JP | 2019-88162 A | 6/2019 |

\* cited by examiner

ELECTRONIC CONTROL DEVICE

TECHNICAL FIELD

The present invention relates to an electronic control device.

BACKGROUND ART

In a vehicle, such as an automobile, for example, an electronic control device for engine control, motor control, or the like is mounted. Such an on-board electronic control device usually includes a heat generating component, such as an electronic component and an electronic circuit, on a circuit board.

As a background art of the technical field, for example, a technique described in PTL 1 described below is known. PTL 1 discloses a heat dissipation structure for an electronic control device in which a plurality of circuit boards is stacked and housed in a housing, in which structure an electronic component mounted on a circuit board is connected to the housing by a thermally conductive adhesive to improve heat dissipation of the electronic component.

CITATION LIST

Patent Literature

PTL 1: JP 2012-175032 A

SUMMARY OF INVENTION

Technical Problem

In a heat dissipation structure of PTL 1, a housing has a heat sink including a plurality of fins to efficiently dissipate heat from the housing to which heat is transferred from an electronic component, and this may increase the size of the entire device. Moreover, heat is accumulated between stacked circuit boards, which may result in insufficient dissipation of heat from the electronic component. As described above, in a conventional heat dissipation structure for an electronic control device including a plurality of circuit boards, it is difficult to improve heat dissipation of an electronic component while keeping the size of the device small.

Solution to Problem

An electronic control device according to the present invention includes a first circuit board having a first mounting surface on which a first electronic component is mounted, a second circuit board having a second mounting surface on which a second electronic component is mounted, and a base member disposed between the first mounting surface and the second mounting surface so as to face the first electronic component and the second electronic component, where a first heat-conducting material is disposed between the base member and the first electronic component, a second heat-conducting material is disposed between the base member and the second electronic component, the base member includes a first region that at least does not overlap the second circuit board when viewed in a line-of-sight direction normal to the first mounting surface and the second mounting surface, and a second region that overlaps both of the first circuit board and the second circuit board when viewed in the line-of-sight direction, a heat dissipation unit including a plurality of heat dissipation fins is provided in the first region of the base member, and a ventilation hole penetrating between the heat dissipation unit and an outside is provided in the second region of the base member.

Advantageous Effects of Invention

According to the present invention, an electronic control device in which heat dissipation of an electronic component is improved with the device being kept small in size can be provided.

Problems, configurations, and effects other than those described above will be clarified by the following description of embodiments.

DESCRIPTION OF EMBODIMENTS

Hereinafter, embodiments of the present invention will be described with reference to the drawings. In the following description and drawings which are illustration for describing the present invention, omission and simplification are made as appropriate for clarification of description. The present invention can be carried out in other various forms. Unless otherwise specified, the number of each component may be one or more.

Positions, sizes, shapes, ranges, and the like of the components illustrated in the drawings may not represent actual positions, sizes, shapes, ranges, and the like. This is for facilitating understanding of the invention. Thus, the present invention is not necessarily limited to positions, sizes, shapes, ranges, and the like disclosed in the drawings.

When there is a plurality of components having the same or a similar function, those components may be described with the same reference numeral with different subscripts. When such a plurality of components needs not be distinguished, description may be made with a subscript omitted.

First Embodiment

A first embodiment of the present invention will be described below with reference to FIGS. 1 to 5.

Figure 1:
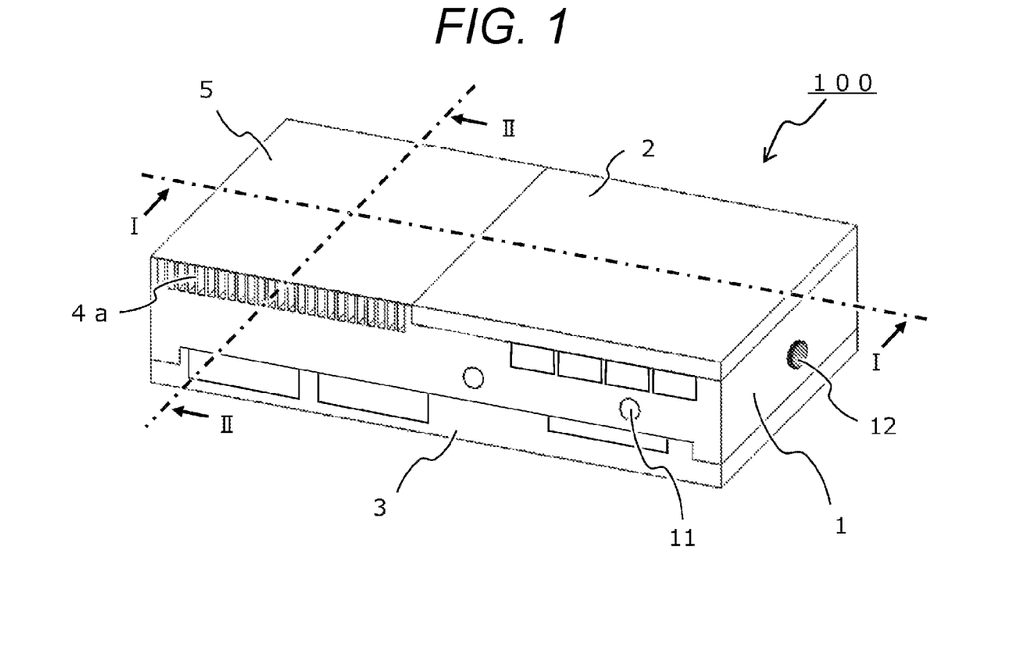
FIG. 1 is an external perspective view of an electronic control device according to a first embodiment of the present invention.
Figure 2:
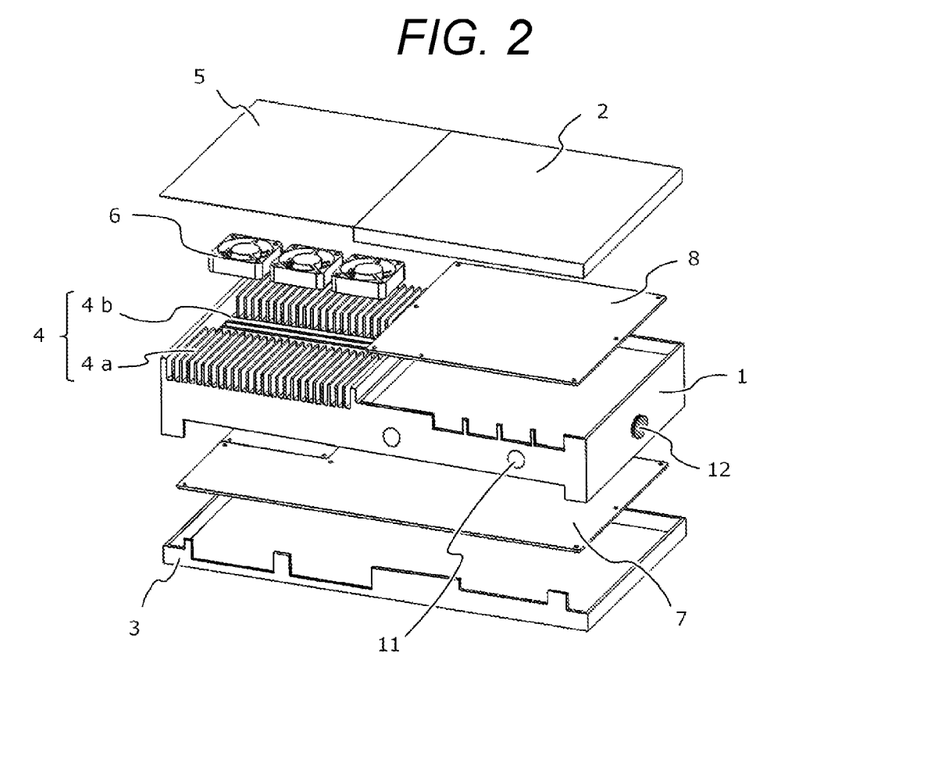
FIG. 2 is an exploded perspective view of the electronic control device illustrated in FIG. 1.
Figure 3:
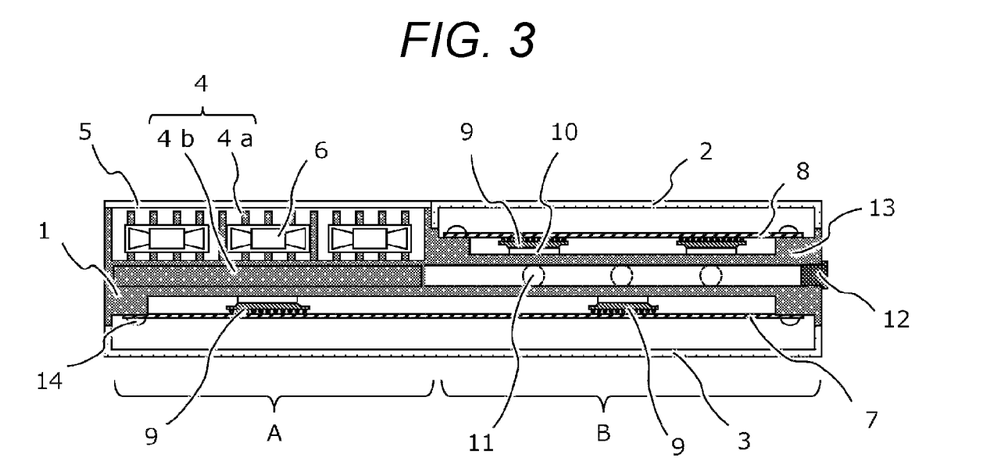
FIG. 3 is a cross-sectional view of the electronic control device illustrated in FIG. 1 taken along a line I-I.
Figure 4:
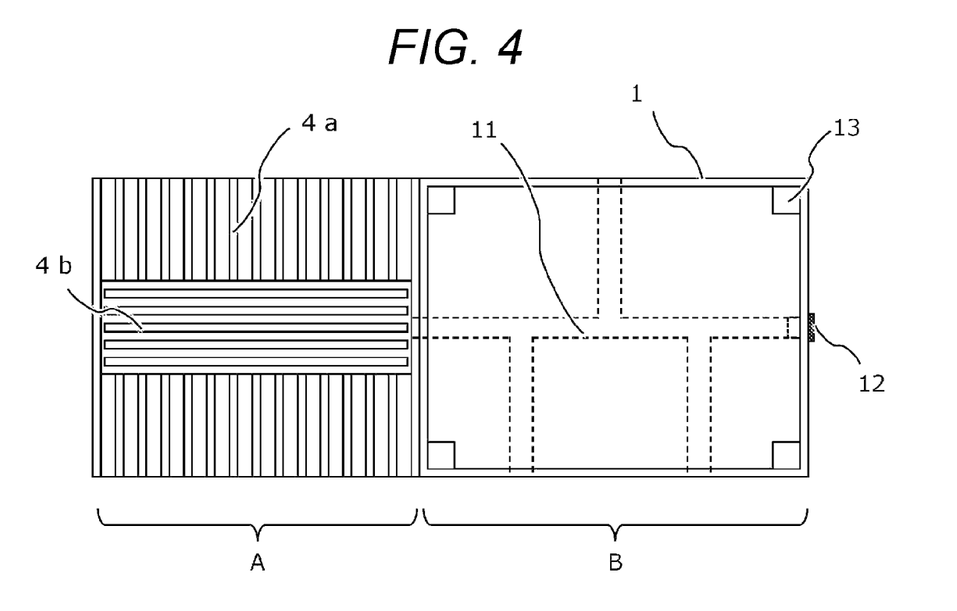
FIG. 4 is a top view of a base member of the electronic control device illustrated in FIG. 1.
Figure 5:
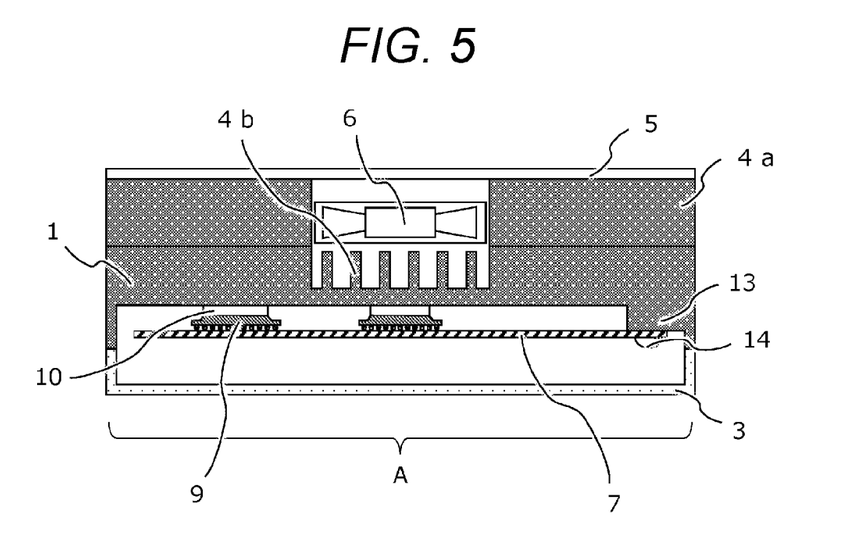
FIG. 5 is a cross-sectional view of the electronic control device illustrated in FIG. 1 taken along a line II-II.

FIG. 1 is an external perspective view of an electronic control device according to a first embodiment of the present invention, and FIG. 2 is an exploded perspective view of the electronic control device illustrated in FIG. 1. FIG. 3 is a cross-sectional view of the electronic control device illustrated in FIG. 1 taken along a line I-I. FIG. 4 is a top view of a base member 1 of the electronic control device illustrated in FIG. 1. FIG. 5 is a cross-sectional view of the electronic control device illustrated in FIG. 1 taken along a line II-II.

An electronic control device 100 according to the first embodiment of the present invention includes a housing including a base member 1, an upper cover 2, and a lower cover 3. The base member 1 includes a heat dissipation unit 4 including a plurality of heat dissipation fins 4a and 4b. A fin cover 5 that covers the heat dissipation unit 4 is provided above the heat dissipation unit 4. The heat dissipation fins 4a provided in surroundings (upper and lower region in FIG. 4) of the heat dissipation unit 4 and the heat dissipation fins 4b provided in a central region of the heat dissipation unit 4 are different from each other in height and orientation. Specifically, the heat dissipation fins 4a have such a height that allows distal end portions of the heat dissipation fins 4a to reach the vicinity of the fin cover 5, and are formed along a longitudinal direction (left-right direction in FIG. 4) of the electronic control device 100. In contrast, the heat dissipation fins 4b have a height smaller than that of the heat dissipation fins 4a to form a space between the heat dissipation fins 4b and the fin cover 5. The heat dissipation fins 4b are formed along a lateral direction (up-down direction in FIG. 4) of the electronic control device 100.

The base member 1 is made of a metal material having excellent thermal conductivity, such as aluminum (for example, ADC12). Cost and weight reduction can be achieved by forming the base member 1 with a sheet of metal, such as iron, or a non-metal material, such as a resin material. Similarly, the upper cover 2, the lower cover 3, and the fin cover 5 can be formed of a sheet of metal, such as iron, or a non-metal material, such as a resin material.

The base member 1, the upper cover 2, the lower cover 3, and the fin cover 5 are fixed to each other by fastening members such as screws (not illustrated). One or a plurality of connectors (not illustrated) and a plurality of Ethernet (registered trademark) terminals are disposed on a side wall on the front side of the housing. A hole or a notch for inserting a connector or the like (not illustrated) is formed in the housing, and the connector or the like is connected, through the hole or the notch, to patterned lines (not illustrated) formed on a first circuit board 7 and a second circuit board 8 housed in the housing. Power and control signals are transmitted and received between the external and the electronic control device 100 via the connector or the like.

Three air cooling fans 6 are disposed between the base member 1 and the fin cover 5. As described above, the fin cover 5 is disposed above the heat dissipation unit 4 of the base member 1 so as the air exhausted from the air cooling fans 6 to flow between the heat dissipation fins 4a and to the outside of the electronic control device 100. The air cooling fans 6 are disposed in the space between the heat dissipation fins 4b and the fin cover 5. At least one of the three air cooling fans 6 is preferably a centrifugal fan so that the air taken in from the lower surface of the air cooling fan 6 changes its direction by 90 degrees to be discharged to a side of the air cooling fan 6. Alternatively, an axial fan or a blower may be used as the air cooling fan 6. For example, it may be configured that the air cooling fan 6 disposed nearest to a second region B, described later, is a centrifugal fan, and the other two air cooling fans 6 are axial fans. One or a plurality of air cooling fans 6 may be disposed. Furthermore, the electronic control device 100 may have a water-cooled structure using a liquid cooling medium such as water instead of air and letting the cooling medium to flow between the heat dissipation fins 4a. In this case, the air cooling fan 6 may not be provided.

The electronic control device 100 includes a plurality of circuit boards inside the housing. The first circuit board 7 is housed between the base member 1 and the lower cover 3, and the second circuit board 8 is housed between the base member 1 and the upper cover 2. Hereinafter, the first circuit board 7 and the second circuit board 8 may not be distinguished and may be simply referred to as "circuit board". As illustrated in FIGS. 3 and 4, boss portions 13 protruding toward the circuit board are provided at corners of the base member 1. The first circuit board 7 and the second circuit board 8 are each fixed to end surfaces of the boss portions 13 by screws 14.

One or a plurality of electronic components 9 each including a semiconductor element such as a microcomputer is mounted on the circuit board. Although not illustrated, a passive element such as a capacitor is also mounted besides the semiconductor element on the circuit board, and patterned lines are also formed on the circuit board to electrically connect the electronic components to a connector or the like (not illustrated). The circuit board is made using, for example, an organic material such as an epoxy resin, preferably, an FR4 material. The circuit board may be a single layer board or a multilayer board.

The electronic components 9 are mounted on mounting surfaces, which are an upper surface (surface on the base member 1 side) of the first circuit board 7 and a lower surface (surface on the base member 1 side) of the second circuit board 8, and the mounting surfaces face each other with the base member 1 therebetween. That is, the base member 1 is disposed between the mounting surface for the electronic component 9 of the first circuit board 7 and the mounting surface for the electronic component 9 of the second circuit board 8, so as to face the electronic components 9. The electronic component 9 is a heat generating component, and is electrically connected to the circuit board with a bonding material such as solder.

A heat-conducting material 10 is disposed between the base member 1 and each of the electronic components 9. The heat-conducting material 10 is provided above (in FIG. 3, on the upper side of) the electronic component 9 mounted on the first circuit board 7, and is provided below (in FIG. 3, on the lower side of) the electronic component 9 mounted on the second circuit board 8. Note that, a boss portion (not illustrated) may be provided on the base member 1 further above or below the heat-conducting material 10 to fill a gap between the base member 1 and the heat-conducting material 10. This allows the heat generated by the electronic component 9 to be transferred to the base member 1 and the heat dissipation unit 4 via the heat-conducting material 10, and heat is dissipated to the atmosphere by natural convection or convective heat transfer caused by the air cooling fan 6 and a ventilation hole 11 described later. Furthermore, a thermal via or a through hole (not illustrated) may be provided in the circuit board so as the heat generated by the electronic component 9 to be transferred also to a surface of the circuit board opposite to the mounting surface. In the electronic control device 100 of the present embodiment, this structure enables effective heat dissipation.

Various types of materials taking a form of, for example, grease, gel, or sheet can be used as the heat-conducting material 10. Typically used is a heat-conducting material taking a form of grease, which includes a thermosetting resin having adhesiveness and a semi-cured resin having a low elasticity. The heat-conducting material 10 may contain a filler formed of metal, carbon, ceramic, or the like having good thermal conductivity. The heat-conducting material 10 may have flexibility that allows deformation to adapt to thermal deformation, vibration, and manufacturing tolerance of the circuit board. As the heat-conducting material 10 having these properties, for example, a semi-cured resin of a silicon-based resin containing a ceramic filler is preferable.

As illustrated in FIGS. 3 and 4, the base member 1 is divided into a first region A (single layer region) in which only one surface of the base member 1 faces the first circuit board 7 and a second region B (stacked region) in which the base member 1 is sandwiched between the first circuit board 7 and the second circuit board 8. That is, the base member 1 has the first region A that at least does not overlap the second circuit board 8 when viewed in a line-of-sight direction (in FIG. 3, the up-down direction) normal to the mounting surface of the first circuit board 7 and the mounting surface of the second circuit board 8, and the second region B that overlaps both of the first circuit board 7 and the second circuit board 8 when viewed in the line-of-sight direction. On a surface in the first region A of the base member 1 opposite to the first circuit board 7, the heat dissipation unit 4 including a plurality of heat dissipation fins 4a and 4b is provided. In the second region B of the base member 1, the ventilation holes 11 are provided in the base member 1. The ventilation holes 11 are drilled from side surfaces of the base member 1 facing the outside of the electronic control device 100, through the inside of the base member 1, to the heat dissipation unit 4 provided in the first region A. The ventilation holes 11 penetrate from the heat dissipation unit 4 to the outside of the electronic control device 100.

In the second region B of the base member 1, the ventilation hole 11 is preferably provided to pass a place overlapping at least part of the electronic component 9 mounted on the circuit board and the heat-conducting material 10 disposed on the electronic component 9 when viewed in the line-of-sight direction. In the second region B of the base member 1, a plugging member 12 is disposed on a right side surface of the electronic control device 100. The plugging member 12 is used for plugging the ventilation hole 11 unnecessary for heat dissipation.

The ventilation hole 11 is formed by drilling from a side surface of the base member 1 using a drill or the like. As illustrated in FIG. 4, at least one of the ventilation holes 11 provided at their places in the base member 1 penetrates to the first region A. Other ventilation holes branch off from this ventilation hole. Each ventilation hole 11 may have a diameter within a thickness of the base member 1 as long as a sufficient pressure loss that causes air to flow by the air cooling fan 6 can be produced. The ventilation hole 11 that is not necessary can be plugged using the plugging member 12 to shut an air passage, so that the most suitable ventilation hole 11 can be selected according to the configuration of the circuit board. Even for a product having a conventional structure, creating a hole in the base member 1 to form the ventilation hole 11 improves heat dissipation without increasing the size of a device, which is applicable to various products.

The ventilation hole 11 may be formed in the base member 1 without drilling using a drill or the like. For example, the ventilation hole 11 can be formed in the base member 1 by producing the base member 1 having a groove, which will become the ventilation hole 11, by die-casting or the like, and then covering the groove with a plate material such as a sheet metal or a resin. This method requires no special post-processing such as drilling, and allows the ventilation hole 11 to be formed by the same method as a conventional method.

The ventilation holes 11 may be formed to have different diameters depending on the length and place of each of the ventilation holes 11. For example, the ventilation hole 11 may be formed to have a larger cross sectional area at a farther location from the first region A. In this case, pressure losses of the ventilation holes 11 are previously obtained by calculation, and a heat dissipation efficiency can be further improved by letting the air flow uniformly in every ventilation hole. The heat dissipation efficiency may be further improved by providing a heat dissipation fin in the ventilation hole 11. Alternatively, as described above, the electronic control device 100 may have a water-cooled structure using the ventilation hole 11 as a water passage. In this case, waterproof can be secured and leakage of water can be prevented by, for example, providing a sealing resin material such as a formed-in-place gasket (FIPG) outside the housing and in a portion in which the first region A communicates with the ventilation hole 11, whereby reliability of the electronic control device 100 is secured.

As illustrated in FIG. 5, in the first region A (single layer region), the electronic component 9 is provided on the first circuit board 7 and is in contact with the base member 1 via the heat-conducting material 10. The heat dissipation unit 4 is provided with the heat dissipation fins 4b disposed immediately below the air cooling fans 6, and the heat dissipation fins 4a provided on both sides of the air cooling fans 6. The heat dissipation fins 4b and the heat dissipation fins 4a are formed along different directions as described above. Specifically, the heat dissipation fins 4b are directed toward the second region B, and partially overlap the ventilation holes 11 in the second region B. Meanwhile, the heat dissipation fins 4a are directed from the space between the fin cover 5 and the heat dissipation fins 4b, that is, a space in which the air cooling fans 6 are disposed, toward both side surfaces regarding the longitudinal direction of the electronic control device 100. This allows the airflow flowing in from the ventilation hole 11 to efficiently flow to the outside of the electronic control device 100 through the space, the air cooling fan 6, and between the heat dissipation fins 4a. Thus, heat dissipation of the electronic component 9 is improved.

As described above, at least one of the air cooling fans 6 is preferably a centrifugal fan. The air cooling fan 6 is disposed above the heat dissipation fins 4b. By operating the air cooling fan 6, air flows in from the outside of the housing to the heat dissipation fins 4b in the first region A through the ventilation hole 11 in the second region B, and is taken in by the air cooling fan 6. The air cooling fan 6 exhausts the air toward the heat dissipation fins 4a on both sides of the air cooling fan 6, and the air passes through the heat dissipation fins 4a to the outside of the housing. That is, in the heat dissipation unit 4, at least part of the heat dissipation fins 4a functions as a ventilation portion for exhausting air from the air cooling fan 6 to the outside of the electronic control device 100.

The air cooling fan 6 is disposed lower than distal ends of the heat dissipation fins 4a but with an upper end of an exhaust port positioned higher than proximal portions of the heat dissipation fins 4a. With this configuration, a continuous air passage is created from the outside of the housing, the ventilation holes 11 in the first region A, the heat dissipation fins 4b in the second region B, the air cooling fan 6, and to the outside of the housing. Thus, all the electronic components 9 mounted on both the circuit boards can efficiently dissipate heat.

As illustrated in FIGS. 3 and 5, on the first circuit board 7, the electronic components 9 are mounted immediately below the heat dissipation fins 4a or 4b on the mounting surfaces facing the first region A of the base member 1. Comparing calorific values of the electronic components 9, the calorific value of the electronic component 9 disposed immediately below the heat dissipation fins 4b is smaller than the calorific value of the electronic component 9 disposed immediately below the heat dissipation fins 4a. That is, the calorific value of the electronic component 9 in contact with the base member 1 via the heat-conducting material 10 immediately below the air cooling fan 6 is smaller than the calorific value of the electronic component 9 in contact with the base member 1 via the heat-conducting material 10 in environs of the air cooling fan 6. In general, a heat dissipation fin having a larger height has a higher heat dissipation effect. Thus, as described above, it is preferable to dispose the electronic component 9 having a larger calorific value under the heat dissipation fins 4a that are disposed in environs of the air cooling fan 6 and have a height higher than the air cooling fan 6 to allow the exhaust air from the air cooling fan 6 to pass therethrough.

The heat dissipation fins 4a and 4b are integrally formed with part of the base member 1 by casting, for example, die-casting. However, the heat dissipation fins 4a and 4b may be manufactured separately from the base member 1, and attached to the base member 1.

For a similar reason, from comparison of calorific values of the electronic components 9 mounted on the first circuit board 7 respectively on the first region A side and the second region B side of the base member 1, it is preferable to determine where the electronic components 9 are disposed such that the calorific value of the electronic component 9 disposed on the first region A side is larger than the calorific value of the electronic component 9 disposed on the second region B side. That is, it is preferable that the calorific value of the electronic component 9 in contact with the first region A of the base member 1 via the heat-conducting material 10 is larger than the calorific value of the electronic component 9 in contact with the second region B of the base member 1 via the heat-conducting material 10.

As described above, in the electronic control device 100 of the present embodiment, the ventilation holes 11 are provided in the second region B in the base member 1 having a limited thickness, and the ventilation holes 11 penetrate the base member 1 from the outside of the electronic control device 100 to the heat dissipation fins 4b in the first region A. This improves heat dissipation of the electronic components 9 mounted on the first circuit board 7 and the second circuit board 8 in the second region B with the size of the housing being kept small in size. The heat dissipation fins 4b are formed to have a height smaller than that of the heat dissipation fins 4a in the environs of the heat dissipation fins 4b, and the air cooling fans 6 are provided immediately above the heat dissipation fins 4b. Furthermore, at least one of the air cooling fans 6, preferably the air cooling fan 6 disposed nearest to the second region B, is a centrifugal fan. Thus, there is no need to provide a space above the air cooling fans 6, which allows disposing the fin cover 5 near the air cooling fans 6. In addition, the heat dissipation fins 4a disposed in the environs of the air cooling fan 6 can at least have distal end portions higher than the air cooling fan 6. Thus, the electronic component 9 in the first region A can efficiently dissipate heat with the housing being kept small in size.

According to the first embodiment of the present invention described above, the following operational effect is obtained.

(1) The electronic control device 100 includes the first circuit board 7 and the second circuit board 8 each having a mounting surface on which the electronic component 9 is mounted, and the base member 1 disposed between the mounting surface of the first circuit board 7 (first mounting surface) and the mounting surface of the second circuit board 8 (second mounting surface) so as to face the electronic component 9 mounted on the first circuit board 7 (first electronic component) and the electronic component 9 mounted on the second circuit board 8 (second electronic component). The heat-conducting material 10 is disposed between the base member 1 and the first electronic component, and the heat-conducting material 10 is disposed between the base member 1 and the second electronic component. The base member 1 has the first region A that at least does not overlap the second circuit board 8 when viewed in the line-of-sight direction normal to the first mounting surface and the second mounting surface, and the second region B that overlaps both of the first circuit board 7 and the second circuit board 8 when viewed in the line-of-sight direction. The heat dissipation unit 4 including a plurality of heat dissipation fins 4a and 4b is provided in the first region A of the base member 1, and the ventilation hole 11 is provided in the second region B of the base member 1 to penetrate between the heat dissipation unit 4 and the outside. Accordingly, the electronic control device 100 having improved heat dissipation of the electronic components 9 with the device being kept small in size can be provided.

(2) The surface of the base member 1 opposite to the surface on which the heat dissipation unit 4 is provided is in contact, in each of the first region A and the second region B, with the first electronic component via the heat-conducting material 10. It is preferable that the calorific value of the first electronic component in contact with the first region A of the base member 1 via the heat-conducting material 10 is larger than the calorific value of the first electronic component in contact with the second region B of the base member 1 via the heat-conducting material 10. Accordingly, the electronic component 9 having a larger calorific value can efficiently dissipate heat via the heat dissipation unit 4 provided in the first region A of the base member 1. Thus, heat dissipation of the electronic component 9 can be further improved.

(3) The electronic control device 100 includes the fin cover 5 that covers the heat dissipation unit 4, and the air cooling fan 6 disposed in the space between the fin cover 5 and the base member 1. The air cooling fan 6 generates an air flow that flows in from the ventilation hole 11 and flows out to the outside via the space. Accordingly, the heat dissipated from the electronic component 9 and accumulated in the housing can be forcibly and efficiently discharged.

(4) The heat dissipation unit 4 includes the ventilation portion in which at least part of a plurality of heat dissipation fins 4a is provided along the direction from the air cooling fan 6 toward the outside at a height different from the height of the ventilation hole 11. The air cooling fan 6 is disposed in the space between the fin cover 5 and the base member 1 such that the upper end of the exhaust port is positioned lower than distal end portions of the heat dissipation fins 4a in the ventilation portion. Accordingly, a structure capable of reliably discharging the heat accumulated in the housing and having the height of the housing being kept low can be provided.

(5) The electronic control device 100 includes a plurality of air cooling fans 6. Among a plurality of air cooling fans 6, at least the air cooling fan 6 disposed nearest to the second region B is preferably a centrifugal fan. Furthermore, a plurality of air cooling fans 6 except the air cooling fan 6 that is a centrifugal fan may each be an axial fan. Accordingly, the exhaust air from the air cooling fans 6 can be reliably and efficiently directed to the ventilation portion and discharged to the outside through the ventilation portion.

(6) In the heat dissipation unit 4, the height and the direction of the heat dissipation fin 4b at a place overlapping the air cooling fan 6 are different from the height and the direction of the heat dissipation fin 4a in a different place when viewed in the line-of-sight direction. Accordingly, the air flow that has flown in from the ventilation hole 11 can efficiently flow out to the outside via the space between the fin cover 5 and the base member 1.

(7) In a place immediately below the air cooling fan 6 and in the environs of the air cooling fan 6, the surface of the base member 1 opposite to the surface provided with the heat dissipation unit 4 in the first region A is in contact with the first electronic component via the heat-conducting material 10. The calorific value of the first electronic component in contact with the base member 1 via the heat-conducting material 10 immediately below the air cooling fan 6 is preferably smaller than the calorific value of the first electronic component in contact with the base member 1 via the heat-conducting material 10 in the environs of the air cooling fan 6. Accordingly, the electronic component 9 having a larger calorific value can efficiently dissipate heat via the heat dissipation fins 4a disposed in the environs of the air cooling fan 6 in the heat dissipation unit 4 and having a larger height than the heat dissipation fins 4b. Thus, heat dissipation of the electronic component 9 can be further improved.

(8) The ventilation hole 11 is preferably provided at a place overlapping at least part of the first electronic component and/or of the second electronic component in the second region B of the base member 1 when viewed in the line-of-sight direction. Accordingly, since the electronic components can efficiently dissipate heat via the ventilation hole 11, heat dissipation can be further improved.

(9) A plurality of ventilation holes 11 is provided in the second region B of the base member 1. A plurality of ventilation holes 11 may have a larger cross-sectional area at a longer distance from the first region A. Accordingly, variations of airflows flowing in the ventilation holes 11 can be suppressed, which further improves a heat dissipation efficiency.

(10) The ventilation hole 11 can be formed by drilling the base member 1 or covering a groove previously provided in the base member 1 made by die-casting. Accordingly, the necessary ventilation holes 11 can be reliably formed in the base member 1.

Second Embodiment

A second embodiment of the present invention will be described below with reference to FIG. 6.

Figure 6:
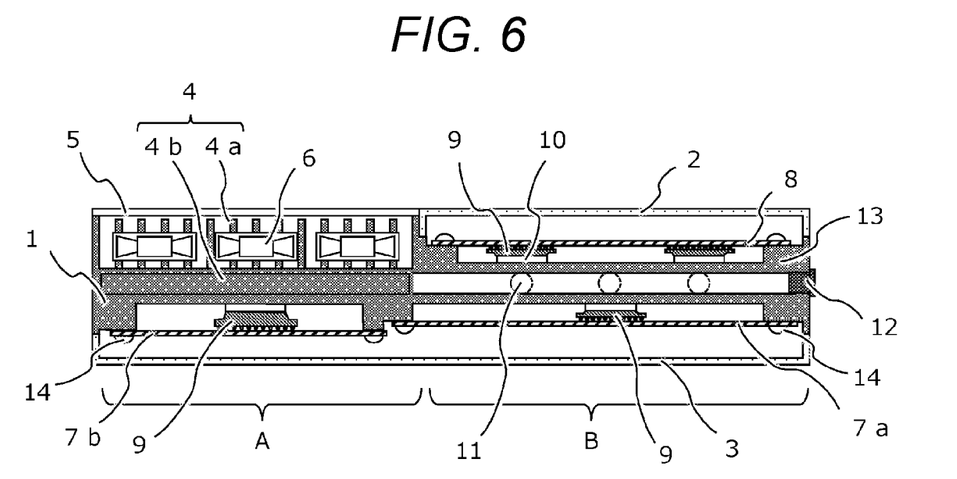
FIG. 6 is a cross-sectional view of an electronic control device according to a second embodiment of the present invention.

FIG. 6 is a cross-sectional view of an electronic control device according to the second embodiment of the present invention, and is a view corresponding to FIG. 3 of the first embodiment.

As illustrated in FIG. 6, in an electronic control device 100 according to the second embodiment of the present invention, a first circuit board 7 is divided into two parts. In the description below, one of the circuit boards will be described as a first circuit board 7a, and the other one will be described as a third circuit board 7b.

The first circuit board 7a and the third circuit board 7b each have a mounting surface on which an electronic component 9 is mounted. The electronic component 9 mounted on the first circuit board 7a and the electronic component 9 mounted on the third circuit board 7b have different heights. The electronic components 9 are in contact with a first region A and a second region B of a base member 1 via heat-conducting materials 10.

From comparison of calorific values of the electronic components 9 mounted respectively on the first circuit board 7a and the third circuit board 7b, like the first embodiment, it is preferable to determine where the electronic components 9 are disposed such that the calorific value of the electronic component 9 disposed on the third circuit board 7b on the first region A side is larger than the calorific value of the electronic component 9 disposed on the first circuit board 7a on the second region B side. That is, it is preferable that the calorific value of the electronic component 9 in contact with the first region A of the base member 1 via the heat-conducting material 10 is larger than the calorific value of the electronic component 9 in contact with the second region B of the base member 1 via the heat-conducting material 10.

As described above, in the electronic control device 100 according to the present embodiment, the circuit board disposed below the base member 1 is divided into the first circuit board 7a and the third circuit board 7b. Also with such a circuit board structure, the electronic component 9 in the first region A can efficiently dissipate heat with the housing being kept small in size. In FIG. 6, the distance from the base member 1 to the first circuit board 7a is shorter than the distance to the third circuit board 7b. However, the distance from the base member 1 to the first circuit board 7a may be longer than or the same as the distance to the third circuit board 7b. Furthermore, at least a portion of the first circuit board 7a and a portion of the third circuit board 7b may overlap.

According to the second embodiment of the present invention described above, the electronic control device 100 includes the third circuit board 7b having the mounting surface on which the electronic component 9 is mounted. A surface of the base member 1 opposite to a surface on which the heat dissipation unit 4 is provided is in contact with the electronic component 9 (third electronic component) mounted on the third circuit board 7b via the heat-conducting material 10 in the first region A, and is also in contact with the electronic component 9 (first electronic component) mounted on the first circuit board 7a via the heat-conducting material 10 in the second region B. The calorific value of the third electronic component is preferably larger than the calorific value of the first electronic component. Accordingly, similarly to the first embodiment, the electronic component 9 having a larger calorific value can efficiently dissipate heat via the heat dissipation unit 4 provided in the first region A of the base member 1. Thus, heat dissipation of the electronic component 9 can be further improved.

Third Embodiment

A third embodiment of the present invention will be described below with reference to FIGS. 7 and 8.

Figure 7:
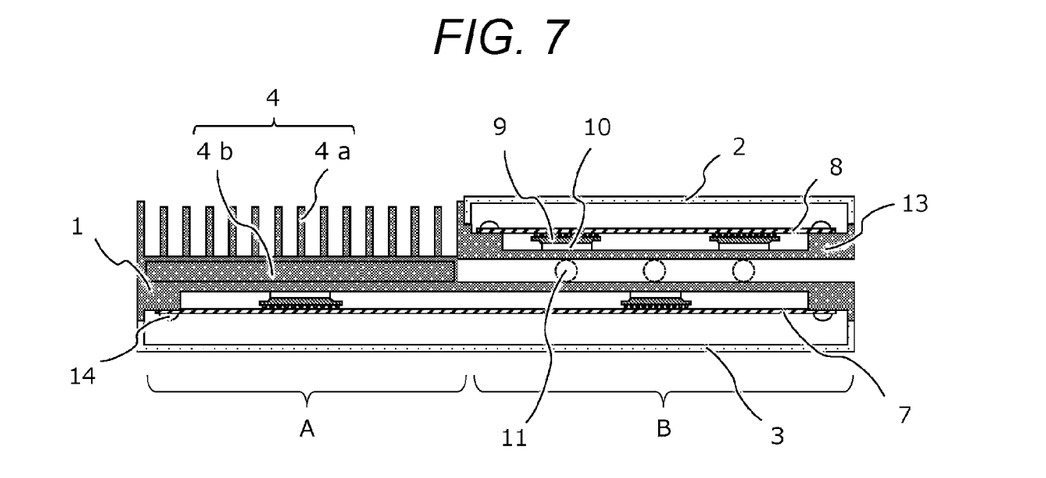
FIG. 7 is a cross-sectional view of an electronic control device according to a third embodiment of the present invention.

FIG. 7 is a cross-sectional view of an electronic control device according to the third embodiment of the present invention, and is a view corresponding to FIG. 3 of the first embodiment. FIG. 8 is a top view of a base member 1 of the electronic control device illustrated in FIG. 7.

The electronic control device 100 of the present embodiment is different from the first embodiment in that the air cooling fan 6, the fin cover 5, and the plugging member 12 illustrated in FIGS. 1 to 5 are removed, and shapes of heat dissipation fins 4a are changed.

As illustrated in FIG. 7, in the electronic control device 100 of the present embodiment, the air cooling fan 6 and the fin cover 5 described in the first embodiment are not provided above the heat dissipation unit 4 formed in a first region A of the base member 1. In the present embodiment, the heat of electronic component 9 is transferred to the base member 1 via heat-conducting materials 10, and is dissipated into the atmosphere from heat dissipation fins 4a and 4b of a heat dissipation unit 4 by natural convection or radiation. Note that, to further improve heat dissipation of the electronic control device 100 of the present embodiment, it is preferable to orient the electronic control device 100 so as the first region A side to be directed toward the direction of gravity, that is, so as the longitudinal direction of the electronic control device 100 to be vertical, with the first region A on the lower side and a second region B on the upper side, and not to plug a ventilation hole 11 with a plugging member 12. Accordingly, when the electronic component 9 generates heat, the heat dissipation fins 4a and 4b and the ventilation holes 11 cause the chimney effect to create an upward airflow, which improves heat dissipation.

Figure 8:
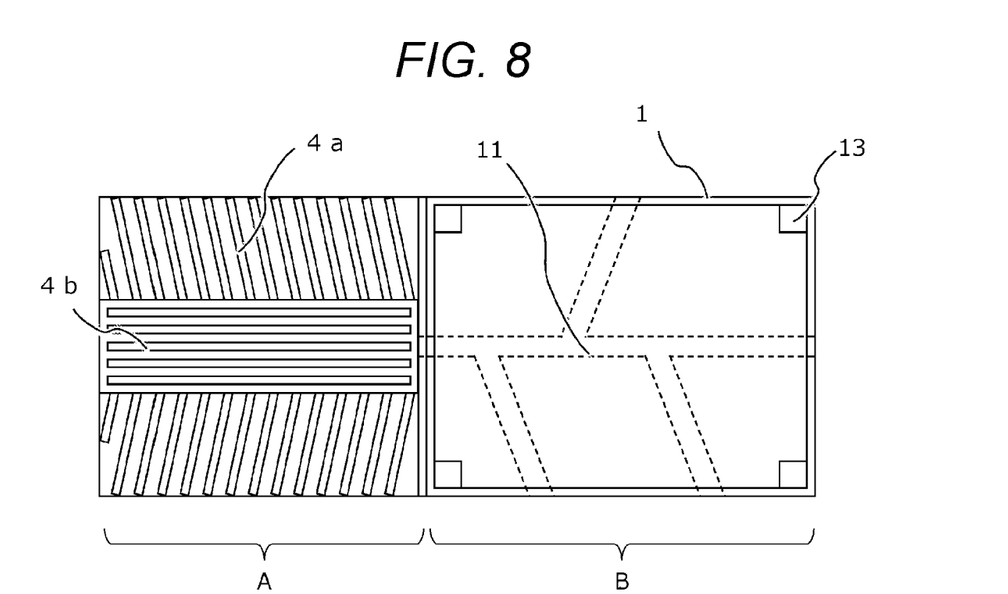
FIG. 8 is a top view of a base member of the electronic control device illustrated in FIG. 7.

In addition, as illustrated in FIG. 8, in the electronic control device 100 of the present embodiment, it is preferable that the heat dissipation fins 4a of the base member 1 are oblique with respect to the second region B. This allows the upward airflow created in the first region A to easily flow to the ventilation hole 11 in the second region B, which improves heat dissipation of the electronic component 9 in the second region B. It is preferable that, in the second region B, the ventilation holes 11 are formed obliquely from side surfaces of the base member 1 toward the first region A. Accordingly, pressure losses in the ventilation holes 11 are reduced and a wind created in the first region A is allowed to easily spread through the entire ventilation holes 11, which improves heat dissipation efficiency.

The structure of the base member 1 in which the directions of the heat dissipation fins 4a and the ventilation holes 11 are inclined has been described above. However, a structure in which all the fins including other heat dissipation fins such as the heat dissipation fins 4b are formed radially or a structure in which one or more of the ventilation holes 11 are formed in a direction vertical to a side surface of the base member 1 may be adopted. The number of the ventilation holes 11 may be increased, or one or a plurality of the plugging members 12 may be provided to plug any one or more of the ventilation holes 11.

Exemplary Embodiments

Figure 9:
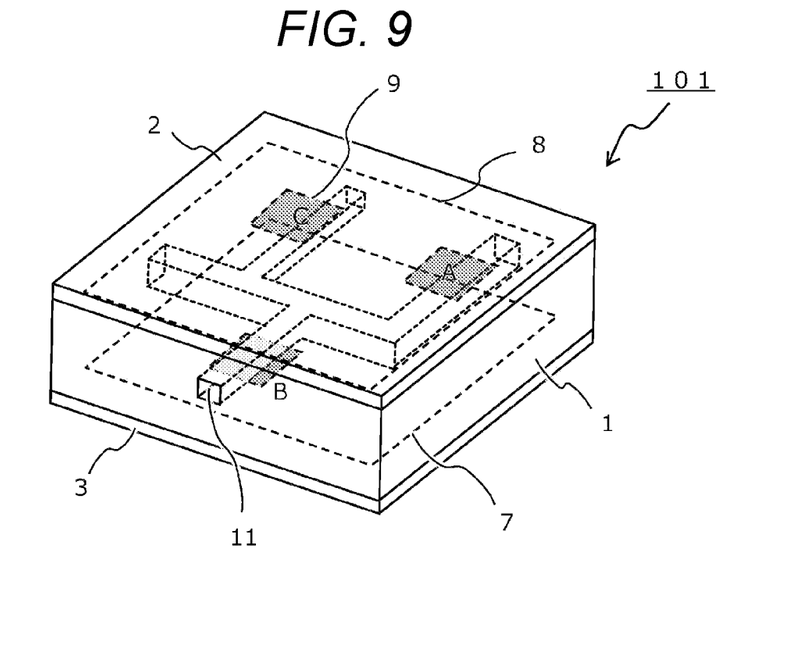
FIG. 9 is an external perspective view of an exemplary embodiment for illustrating a heat dissipation effect of the present invention.

An exemplary embodiment of the present invention will be described below with reference to FIGS. 9 and 10. In the exemplary embodiment, an electronic control device 101 having an appearance illustrated in FIG. 9 was modeled using the following members. The electronic control device 101 is a model of the second region B of the base member 1 illustrated in the cross-sectional views in FIGS. 3 and 7 and the top view in FIG. 4 and surroundings of the second region B of the described electronic control device 100 of the first to third embodiments.

In the exemplary embodiment, a housing had an outer shape of 217 mm×220 mm×76.5 mm (thickness). A first circuit board 7 and a second circuit board 8 were each fixed to boss portions (not illustrated) provided at four corners of a base member 1 and three places each located between two of the corners, that is, at seven places in total, using screws (not illustrated). To accommodate the circuit boards in the housing, the base member 1 was sandwiched and fixed between an upper cover 2 and a lower cover 3. The base member 1 was made of an ADC12 material having a thermal conductivity of 96.3 W/mK and an emissivity of 0.4, and the upper cover 2 and the lower cover 3 were made of sheet metals having a thermal conductivity of 65.5 W/mK and an emissivity of 0.09.

Three electronic components 9 were mounted on an upper surface of the first circuit board 7 and a lower surface of the second circuit board 8. In FIG. 9, mounting positions of the three electronic components 9 are indicated by A, B, and C. The electronic components 9 at their respective positions were referred to as electronic components 9A, 9B, and 9C. The electronic components 9A and 9C each were a Flip Chip Ball Grid Array (FCBGA) type semiconductor devices having a size of 23 mm×23 mm×3.1 mm (thickness) mounted on the second circuit board 8. The electronic component 9B was a Quad Flat Non-leaded (QFN) semiconductor device having a size of 30 mm×30 mm×3.4 mm (thickness) mounted on the first circuit board 7. As illustrated in FIG. 9, each electronic component 9 was disposed at a place overlapping the ventilation hole 11 in a plan view.

The circuit board was formed of an FR4 material having a size of 220 mm×197 mm×1.6 mm (thickness). The circuit board is an 8-layer multilayer board, and has an equivalent thermal conductivity of 69.4 W/mK in an in-plane direction and 0.45 W/mK in a vertical direction.

The heat-conducting material 10 was formed using a low-elastic heat transfer material having a thermal conductivity of 2 W/mK and containing a thermally conductive filler in a silicon-based resin. The heat-conducting material 10 was provided on top of every electronic component 9, and had the same size as the electronic component 9 and a thickness of 1.9 mm (constant).

A total of four ventilation holes 11 were created in the base member 1 having a thickness of 20 mm. For ease of modeling in a thermal fluid analysis, a cross section of the ventilation hole 11 was made square with a size of 15 mm×15 mm. To simulate an air flow in the ventilation holes 11 created by an air cooling fan 6, a wind speed of 5 m/s is given in the ventilation hole 11 penetrating to a first region A (not illustrated), and air was taken in from the ventilation holes 11 at three locations on side surfaces of the housing and was discharged from one place.

For comparison with the exemplary embodiment of the present invention, a comparative example was prepared. The comparative example had a structure of that of the electronic control device 101 illustrated in FIG. 9 but with no ventilation hole 11. The material of the base member 1 was formed of an ADC12 having the same thermal conductivity and emissivity as those of the exemplary embodiment. A circuit board, an electronic component 9, a heat-conducting material 10, and the like were respectively made of the same materials and disposed at the same places as those of the exemplary embodiment.

To check a heat dissipation effect of the first to third embodiments of the present invention, a junction temperature of the electronic component 9 in each of the exemplary embodiment and the comparative example was measured. The junction temperature is a surface temperature of a semiconductor chip constituting the electronic component 9, and is an operation compensation temperature of the electronic component 9. The junction temperature was measured under an environmental temperature of 80° C. and under a condition where calorific values of the electronic components 9A, 9B, and 9C were respectively 2 W, 4 W, and 2 W. Although not illustrated in FIG. 9, other electronic components also generate heat, and the total calorific value of the electronic control device 101 was set to 15 W.

Figure 10:
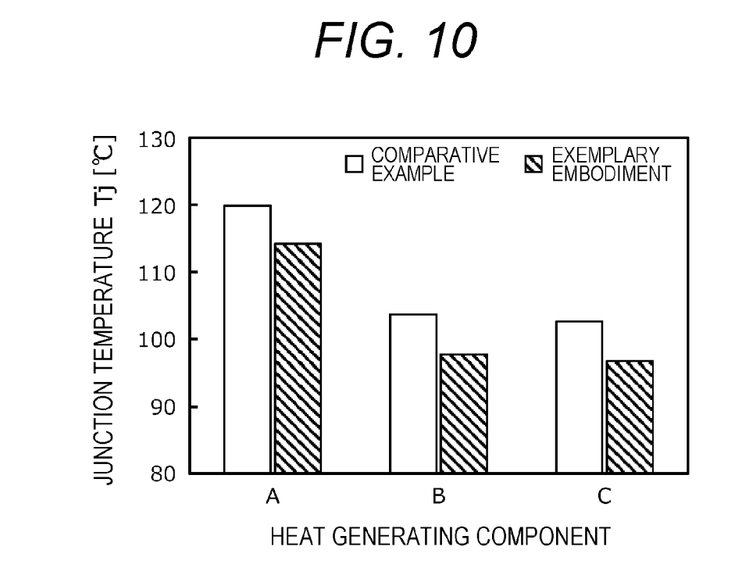
FIG. 10 is a chart showing comparison of junction temperatures between the exemplary embodiment and a comparative example.

FIG. 10 is a chart showing comparison of junction temperatures between the exemplary embodiment and the comparative example. As shown in FIG. 10, it was confirmed that the junction temperature under the above condition was lower in all the electronic components of the exemplary embodiment than that of the comparative example, where the temperature difference was −5.7° C. in the electronic component 9A, −6.0° C. in the electronic component 9B, and −5.9° C. in the electronic component 9C. Thus, according to the electronic control device 101 having the structure described in the exemplary embodiment, it was confirmed that heat dissipation was improved with the housing being kept small in size. Thus, also in the electronic control device 100 according to the first to third embodiments, heat dissipation of the electronic component can be improved with the device being kept small in size as compared with the related art.

Note that the present invention is not limited to the exemplary embodiment described above, and includes various modifications. In addition, part of the configuration of the exemplary embodiment can be replaced with a configuration of another exemplary embodiment, and the configuration of an exemplary embodiment can be added to the configuration of another exemplary embodiment.

Embodiments and various exemplary modifications have been merely described above as examples, and the present invention is not limited to the contents of the embodiments and various exemplary modifications as long as the characteristics of the invention are not impaired. Although various embodiments and exemplary modifications have been described above, the present invention is not limited to the contents of the various embodiments and exemplary modifications. Other aspects conceivable within the scope of the technical idea of the present invention are also included within the scope of the present invention.

REFERENCE SIGNS LIST 1 base member
2 upper cover
3 lower cover
4 heat dissipation unit
4a, 4b heat dissipation fin
5 fin cover
6 air cooling fan
7, 7a first circuit board
7b third circuit board
8 second circuit board
9 electronic component
10 heat-conducting material
11 ventilation hole
12 plugging member
13 boss portion
14 screw
100 electronic control device

The invention claimed is:

1. An electronic control device comprising:
a first circuit board having a first mounting surface on which a first electronic component is mounted;
a second circuit board having a second mounting surface on which a second electronic component is mounted; and
a base member disposed between the first mounting surface and the second mounting surface so as to face the first electronic component and the second electronic component, wherein
a first heat-conducting material is disposed between the base member and the first electronic component,
a second heat-conducting material is disposed between the base member and the second electronic component,
the base member includes a first region that at least does not overlap the second circuit board when viewed in a line-of-sight direction normal to the first mounting surface and the second mounting surface, and a second region that overlaps both of the first circuit board and the second circuit board when viewed in the line-of-sight direction,
a heat dissipation unit including a plurality of heat dissipation fins is provided in the first region of the base member, and
a ventilation hole penetrating between the heat dissipation unit and an outside is provided in the second region of the base member;
wherein the ventilation hole is provided at a place in the second region of the base member overlapping at least part of at least one of (i) the first electronic component or (ii) the second electronic component, when viewed in the line-of-sight direction.

2. The electronic control device according to claim 1, wherein
a surface of the base member opposite to a surface on which the heat dissipation unit is provided is in contact with the first electronic component via the first heat-conducting material in the first region and the second region, and
a calorific value of the first electronic component in contact with the first region of the base member via the first heat-conducting material is larger than a calorific value of the first electronic component in contact with the second region of the base member via the first heat-conducting material.

3. The electronic control device according to claim 1, further comprising
a third circuit board having a third mounting surface on which a third electronic component is mounted, wherein
a surface of the base member opposite to a surface on which the heat dissipation unit is provided is in contact with the third electronic component via a third heat-conducting material in the first region and in contact with the first electronic component via the first heat-conducting material in the second region, and
a calorific value of the third electronic component is larger than a calorific value of the first electronic component.

4. The electronic control device according to claim 1, further comprising:
a cover that covers the heat dissipation unit; and
an air cooling fan disposed in a space between the cover and the base member, wherein
the air cooling fan creates an air flow that flows in from the ventilation hole and flows out to an outside via the space.

5. The electronic control device according to claim 4, wherein
the heat dissipation unit includes a ventilation portion in which at least part of the plurality of heat dissipation fins is provided along a direction from the air cooling fan toward an outside at a height different from a height of the ventilation hole.

6. The electronic control device according to claim 5, wherein
the air cooling fan is disposed in the space with an upper end of an exhaust port positioned lower than distal end portions of the heat dissipation fins at the ventilation portion.

7. The electronic control device according to claim 4, further comprising
a plurality of the air cooling fans, wherein
at least the air cooling fan disposed nearest to the second region among the plurality of the air cooling fans is a centrifugal fan.

8. The electronic control device according to claim 7, wherein
the plurality of the air cooling fans are axial fans except for the air cooling fan disposed nearest to the second region.

9. The electronic control device according to claim 4, wherein
in the heat dissipation unit, a height and a direction of the heat dissipation fin at a place overlapping the air cooling fan are different from a height and a direction of the heat dissipation fin in a different place when viewed in the line-of-sight direction.

10. The electronic control device according to claim 4, wherein
in a place immediately below the air cooling fan and in environs of the air cooling fan, the surface of the base member opposite to the surface provided with the heat dissipation unit is in contact with the first electronic component via the first heat-conducting material in the first region, and
a calorific value of the first electronic component that is in contact with the base member via the first heat-conducting material in the place immediately below the air cooling fan is smaller than a calorific value of the first electronic component that is in contact with the base member via the first heat-conducting material in the environs of the air cooling fan.

11. The electronic control device according to claim 1, wherein
a plurality of the ventilation holes is provided in the second region of the base member, and
the plurality of the ventilation holes has a larger cross-sectional area at a longer distance from the first region.

12. The electronic control device according to claim 1, wherein
the ventilation hole is formed by drilling the base member or covering a groove previously provided in the base member made by die-casting.

13. The electronic control device according to claim 1, wherein
a heat dissipation fin is provided inside the ventilation hole.

* * * * *